US012573983B2

(12) United States Patent
Brown et al.

(10) Patent No.: US 12,573,983 B2
(45) Date of Patent: Mar. 10, 2026

(54) EXTERNAL CRYSTAL OSCILLATOR CYCLE DURATION AND VARIATION TRACKING

(71) Applicant: Hewlett-Packard Development Company, L.P., Spring, TX (US)

(72) Inventors: Gary T. Brown, Boise, ID (US); Vincent C. Skurdal, Boise, ID (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 18/696,695

(22) PCT Filed: Oct. 1, 2021

(86) PCT No.: PCT/US2021/053115
§ 371 (c)(1),
(2) Date: Mar. 28, 2024

(87) PCT Pub. No.: WO2023/055388
PCT Pub. Date: Apr. 6, 2023

(65) Prior Publication Data
US 2025/0007460 A1      Jan. 2, 2025

(51) Int. Cl.
| | |
|---|---|
| *G01R 23/15* | (2006.01) |
| *G01R 29/027* | (2006.01) |
| *H03B 5/32* | (2006.01) |
| *H03K 3/03* | (2006.01) |

(52) U.S. Cl.
CPC .............. *H03B 5/32* (2013.01); *G01R 23/15* (2013.01); *G01R 29/0273* (2013.01); *H03K 3/0315* (2013.01)

(58) Field of Classification Search
CPC .. G01R 23/15; G01R 23/155; G01R 29/0273; H03B 5/30; H03B 5/32; H03K 3/0315; H03K 3/0322; H03K 5/19; H03L 7/085; H03L 7/0995
See application file for complete search history.

(56) References Cited

U.S. PATENT DOCUMENTS

| | | | | |
|---|---|---|---|---|
| 5,416,446 | A * | 5/1995 | Holler, Jr. ............ | H03K 3/0315 331/25 |
| 6,333,652 | B1 * | 12/2001 | Iida ........................ | H03L 7/0805 327/284 |
| 6,502,050 | B1 * | 12/2002 | Chan ..................... | H03L 7/0814 702/116 |
| 6,754,840 | B2 * | 6/2004 | Poisner ................. | G06F 21/725 713/500 |
| 9,360,915 | B1 | 6/2016 | Schuttenberg | |
| 10,164,646 | B1 | 12/2018 | Lu et al. | |
| 2001/0045849 | A1 * | 11/2001 | Kurita .................... | H03K 3/354 327/156 |

(Continued)

*Primary Examiner* — Levi Gannon
(74) *Attorney, Agent, or Firm* — Foley & Lardner LLP

(57) ABSTRACT

Secure circuitry of an integrated circuit detects a duration of a clock cycle of a crystal oscillator external to the integrated circuit, using a digital ring oscillator internal to the integrated circuit and having a higher frequency than the crystal oscillator. The secure circuitry calculates a variation in the duration of the clock cycle. In response to the duration being greater than a maximum duration limit, the duration being less than a minimum duration limit, and/or the variation being greater than a maximum variation limit, the secure circuitry performs an action.

13 Claims, 7 Drawing Sheets

(56)  References Cited

U.S. PATENT DOCUMENTS

| | | | |
|---|---|---|---|
| 2005/0093634 A1* | 5/2005 | Smith | H03L 1/022 |
| | | | 331/16 |
| 2008/0048791 A1* | 2/2008 | Fahim | H03L 7/085 |
| | | | 331/1 A |
| 2011/0007859 A1* | 1/2011 | Ueda | H03L 7/18 |
| | | | 327/158 |
| 2018/0175866 A1 | 6/2018 | Oki | |
| 2019/0052280 A1* | 2/2019 | Perez | H03L 7/0997 |
| 2020/0014390 A1* | 1/2020 | Aboudina | H03L 7/099 |

* cited by examiner

Figure 1:
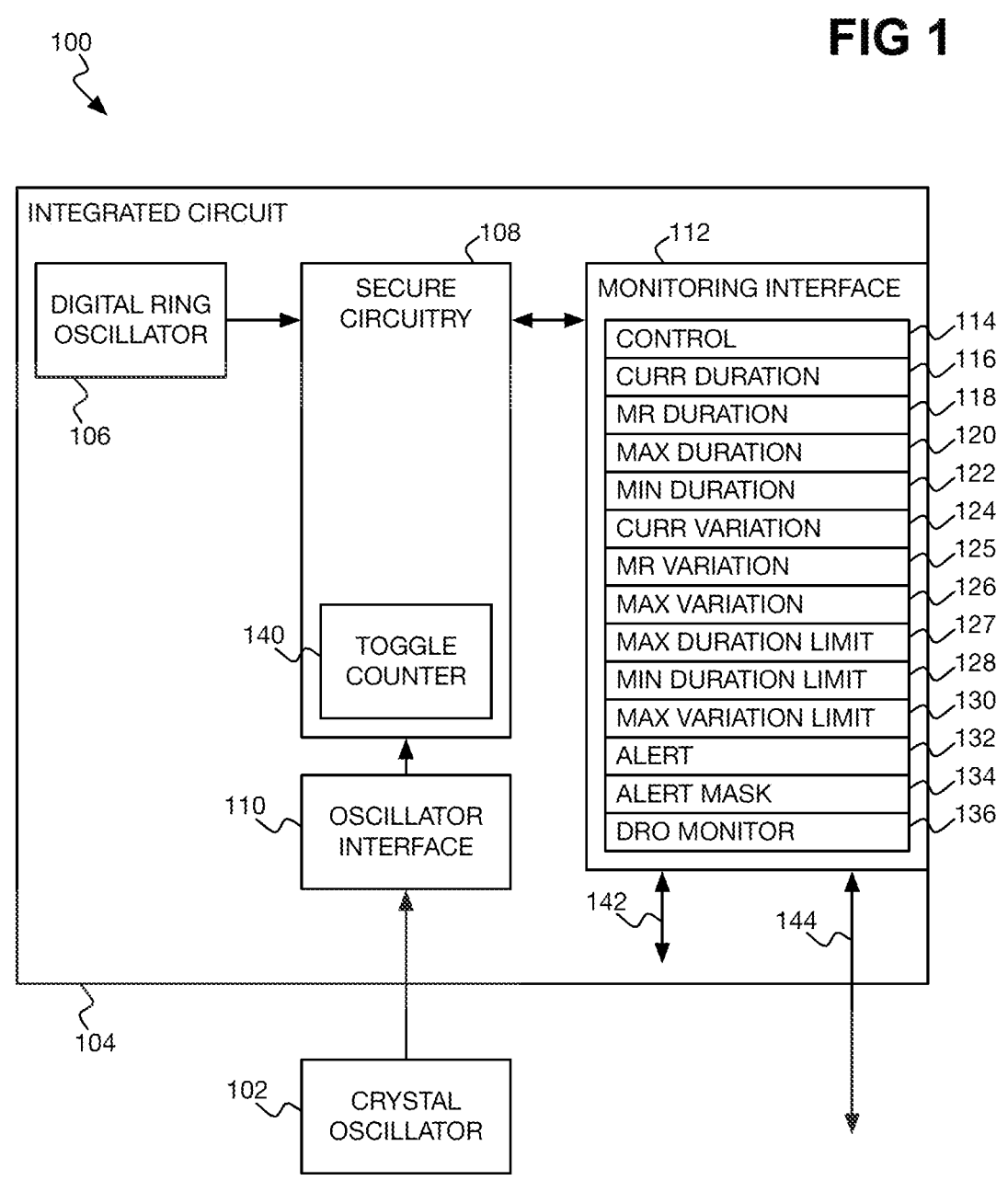

INTEGRATED CIRCUIT

DIGITAL RING OSCILLATOR

106

108
SECURE CIRCUITRY

140
TOGGLE COUNTER

112
MONITORING INTERFACE

| | |
|---|---|
| CONTROL | 114 |
| CURR DURATION | 116 |
| MR DURATION | 118 |
| MAX DURATION | 120 |
| MIN DURATION | 122 |
| CURR VARIATION | 124 |
| MR VARIATION | 125 |
| MAX VARIATION | 126 |
| MAX DURATION LIMIT | 127 |
| MIN DURATION LIMIT | 128 |
| MAX VARIATION LIMIT | 130 |
| ALERT | 132 |
| ALERT MASK | 134 |
| DRO MONITOR | 136 |

110
OSCILLATOR INTERFACE

142

144

104

102
CRYSTAL OSCILLATOR

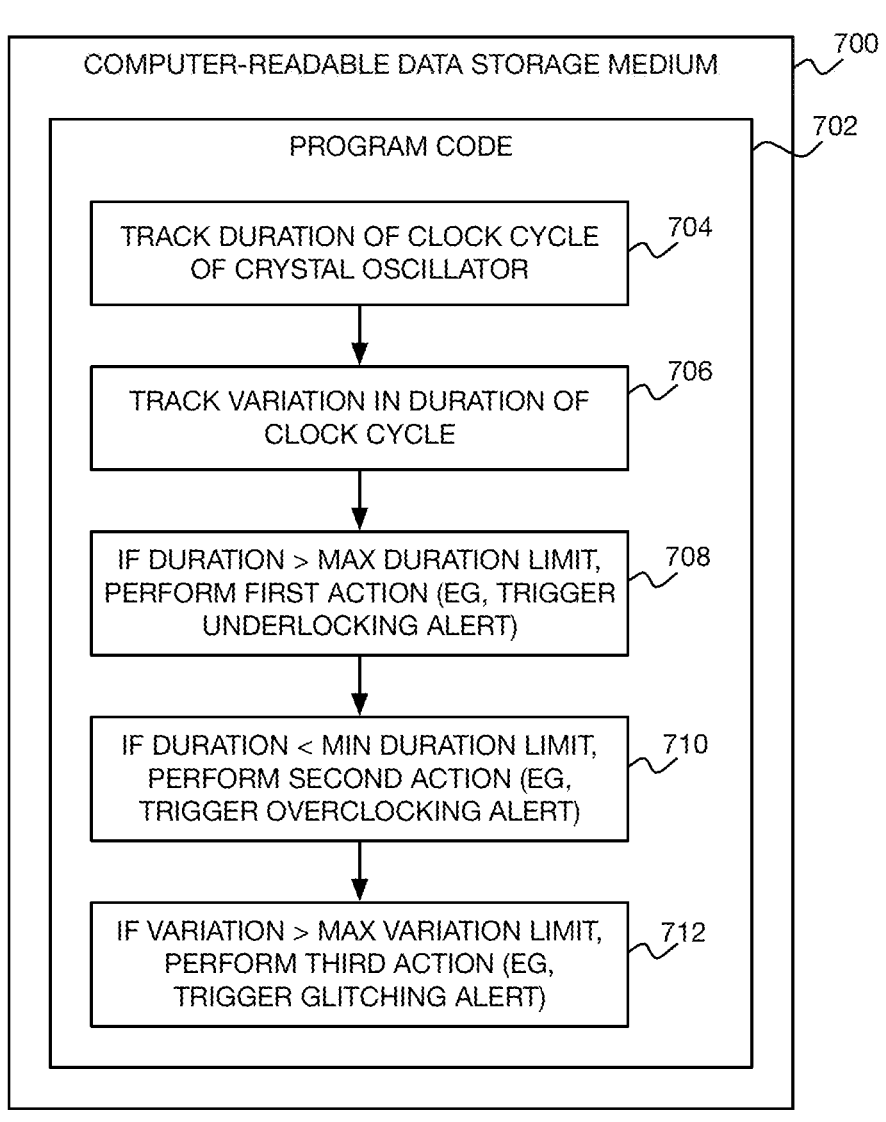

COMPUTER-READABLE DATA STORAGE MEDIUM — 700

PROGRAM CODE — 702

TRACK DURATION OF CLOCK CYCLE OF CRYSTAL OSCILLATOR — 704

TRACK VARIATION IN DURATION OF CLOCK CYCLE — 706

IF DURATION > MAX DURATION LIMIT, PERFORM FIRST ACTION (EG, TRIGGER UNDERLOCKING ALERT) — 708

IF DURATION < MIN DURATION LIMIT, PERFORM SECOND ACTION (EG, TRIGGER OVERCLOCKING ALERT) — 710

IF VARIATION > MAX VARIATION LIMIT, PERFORM THIRD ACTION (EG, TRIGGER GLITCHING ALERT) — 712

800

EXTERNAL CRYSTAL OSCILLATOR CYCLE DURATION AND VARIATION TRACKING

BACKGROUND

Computing devices include general-purpose computing devices as well as application-specific computing devices. General-purpose computing devices include desktop, laptop, notebook, and server computers, as well as smartphones, tablet computing devices, and other types of computing devices. Application-specific computing devices are also referred to as embedded systems, and are devices designed to perform dedicated functions, either as independent systems or as part of larger systems. Embedded systems can be implemented in conjunction with peripheral devices, such as printing and other types of devices, as well as devices as disparate as kitchen appliances, automotive electronics, network cameras, and so on.

Both general-purpose and application-specific computing devices often have network connectivity, permitting them to be globally connected with other computing devices via the Internet. While such interconnectedness has resulted in services and functionality almost unimaginable in the pre-Internet world, not all the effects of the Internet have been positive. A downside, for instance, to having a computing device potentially reachable from nearly any other device around the world is the computing device's susceptibility to malicious cyber attacks that likewise were unimaginable decades ago. Computing devices are also susceptible to cyber attack even if not connected to the Internet or another network.

BRIEF DESCRIPTION OF THE DRAWINGS

FIG. 1 is a diagram of an example computing device including an integrated circuit (IC) having secure circuitry to monitor a crystal oscillator of the computing device that is external to the IC, using a digital ring oscillator (DRO) of the IC.

FIG. 7 is a diagram of an example non-transitory computer-readable data storage medium storing program code executable by the secure circuitry of the IC of FIG. 1 to monitor a crystal oscillator using the DRO of the IC.

DETAILED DESCRIPTION

Figure 2:
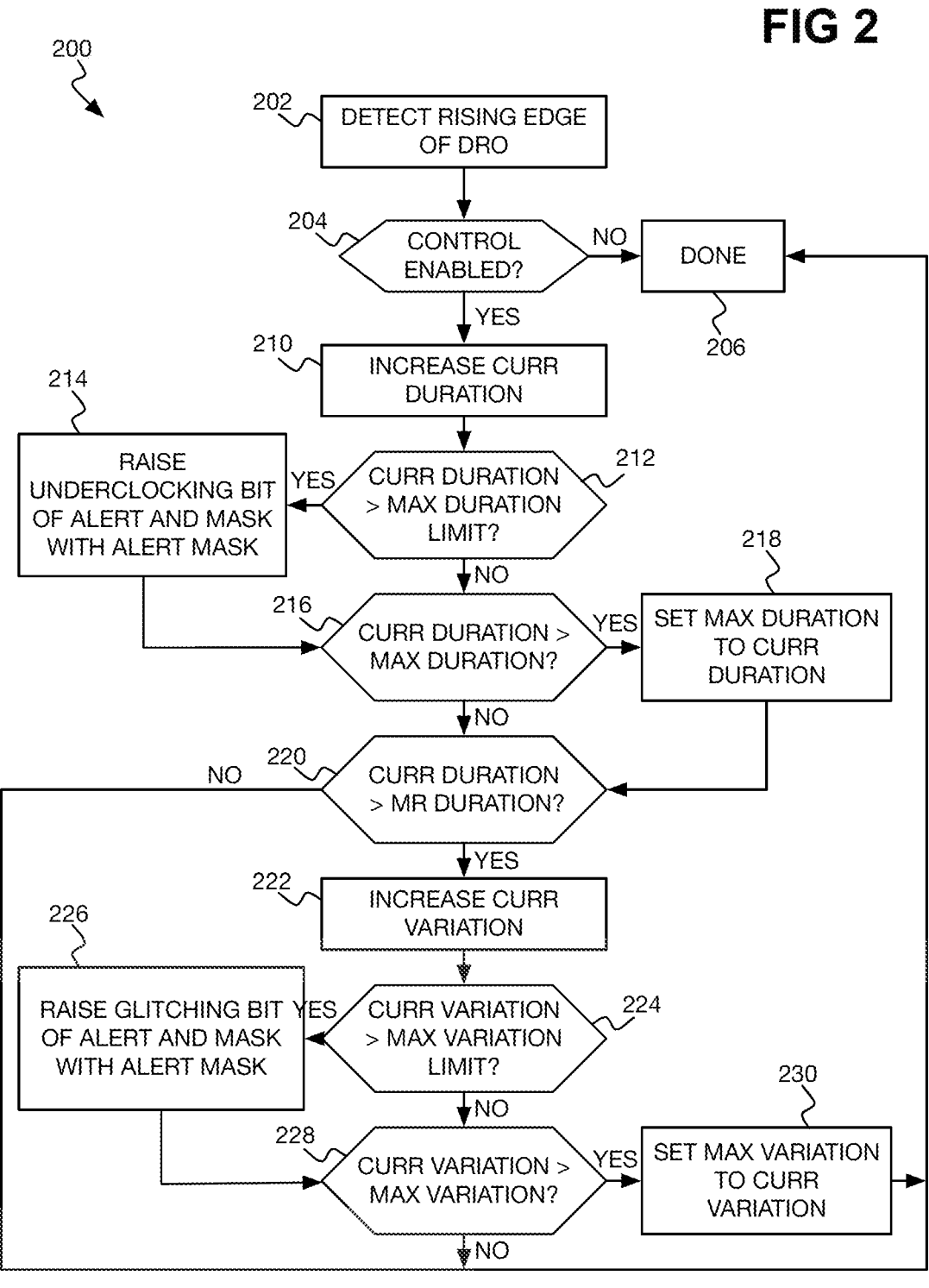
FIG. 2 is a flowchart of an example method for monitoring a crystal oscillator, and which is specifically performed responsive to a rising edge of the DRO of the IC of FIG. 1.

As noted in the background, computing devices include general-purpose computing devices as well as application-specific computing devices that are also referred to as embedded systems. Both types of computing devices can be susceptible to cyber attacks to cause the devices to perform impermissible functionality, to otherwise compromise the devices to impermissibly access data stored by the devices, and so on. One way by which a computing device can be compromised includes altering the crystal oscillator governing the system clock according to which processors, semiconductor memory, and other components of the device are synchronized for operation.

A crystal oscillator can be in the form of a quartz crystal oscillator integrated circuit (IC), and is more generally an electronic oscillator circuit that uses the mechanical resonance of a vibrating crystal of piezoelectric material to create an electrical signal with constant frequency. This frequency is often used to track time and to provide a stable clock signal for digital ICs, as well as stabilize frequencies for wireless transmitters and receivers. The crystal oscillator of a computing device thus has a specified frequency governing the operation of other components of the device.

Because the components of a computing device may be designed to operate at the specified frequency provided by the crystal oscillator of the device, nefarious parties may attempt to compromise the security of the computing device in part by manipulating the crystal oscillator. For example, the crystal oscillator may be purposefully overclocked to operate at a higher frequency than expected, or may be purposefully underclocked to operate at a lower frequency than expected. As another example, the crystal oscillator may be temporarily stopped, or glitched, such that the oscillator does not provide a uniform frequency over time.

When a crystal oscillator has been overclocked, underclocked, or glitched, a nefarious party may be able to cause the computing device of which the oscillator is a part to perform in impermissible ways. As noted, the computing device may perform functionality that it is not permitted to perform, or data stored at or accessible via the computing device may be impermissibly retrieved. Therefore, monitoring a crystal oscillator for improper operation is one way by which whether the computing device has been compromised can be detected.

Techniques described herein monitor a crystal oscillator of a computing device using a digital ring oscillator (DRO) that is part of an IC external to the crystal oscillator. Secure circuitry of the IC detects or tracks clock cycle duration of the crystal oscillator using the DRO, and calculates or tracks variation in the clock cycle duration of the oscillator. If the clock cycle duration is greater than a maximum duration limit or is less than a minimum duration limit, or if the variation in clock cycle duration is greater than a maximum variation limit, then an action can be performed as a result of the computing device having potentially been compromised.

FIG. 1 shows an example computing device 100. The computing device 100 may be a general-purpose computing device, or the device 100 may be an application-specific computing device (i.e., an embedded system). The computing device 100 includes a crystal oscillator 102 and an IC 104. The crystal oscillator 102 is external to the IC 104, and has a specified frequency. The computing device 100 can include other components external to the IC 104, such as one or multiple processors, memory, and so on. The IC 104 is security hardened in that the IC 104 is securely isolated from other components of the device 100 and is inaccessible to such components except via provided interfaces of the IC 104.

The IC 104 includes a DRO 106. A DRO 106 can also be referred to as a ring oscillator, and is a device composed of an odd number of logical NOT gates in a ring, whose output oscillates between two voltage levels representing true and false. The NOT gates, or inverters, are attached in a chain, and the output of the last inverter is fed back into the first inverter. The final output is asserted a finite amount of time after the first input is asserted, and the resulting feedback of the last output to the input causes oscillation. The DRO 106 has a specified frequency that is higher than the frequency of the crystal oscillator 102. The DRO 106 is internal to the IC 104.

The specified frequency of the DRO 106 is a nominal frequency. The actual frequency of the DRO 106 varies as a result of the voltage used to operate the DRO 106, the temperature of the IC 104 of which the DRO 106 is a part, and manufacturing tolerances when fabricating the IC 104. Therefore, while the specified frequency of the DRO 106 may nominally be a fractional multiple of the specified frequency of the crystal oscillator 102, the actual ratio of the frequency of the DRO 106 to the frequency of the oscillator 102 may not be able to be determined until the DRO 106 is used to effectively monitor the crystal oscillator 102.

The IC 104 also includes secure circuitry 108. The secure circuitry 108 may be in the form of an application-specific IC (ASIC) that is integrated within the IC 104. The secure circuitry 108 is secure at least in that it is part of the IC 104 that is securely isolated from components of the computing device 100 external to the IC 104. The secure circuitry 108 is communicatively coupled to the DRO 106, in that the circuitry 108 receives a clock signal that the DRO 106 provides at the specified frequency of the DRO 106. In one implementation, the clock signal provided by the DRO 106 may be reduced in frequency before the signal is input at the secure circuitry 108. Even if reduced in frequency, the resulting clock signal still has a higher frequency than the frequency of the crystal oscillator 102.

The IC 104 includes an oscillator interface 110, which is the interface by which the IC 104 interconnects with the crystal oscillator 102 to receive the clock signal provided by the oscillator 102 at the specified frequency of the oscillator 102. The oscillator interface 110 is an input interface, in that the IC 104 can receive or read the clock signal provided by the oscillator 102 at the interface 110 but cannot provide information to the oscillator 102 on the interface 110 or otherwise write to interface 110. The secure circuitry 108 is communicatively connected to the oscillator interface 110.

The IC 104 has a monitoring interface 112, which is the interface by which the IC 104 provides information as to monitoring of the crystal oscillator 102 by the secure circuitry 108 using the DRO 106, and by which the IC 104 receives information as to how such monitoring is to be performed. The secure circuitry 108 is bidirectionally communicatively connected to the monitoring interface 112, and can read from and write to the interface 112. The monitoring interface 112 has a number of registers 114, 116, 118, 120, 124, 125, 126, 127, 128, 130, 132, 134, and 136, some of which are single-bit and others of which are multiple-bit registers, and some of which are read-only and others of which are write-only or read-and-write registers from the perspective of the secure circuitry 108.

Specifically, the monitoring interface 112 can include a control register 114. The control register 114 can be a single-bit register. The control register 114 is set by a component within the IC 104 or by a component external to the IC 104 to indicate that the secure circuitry 108 is to monitor the crystal oscillator 102. The control register 114 is cleared to indicate that the secure circuitry 108 is not to monitor the crystal oscillator 102. The control register 114 may be considered a read-only register from the perspective of the secure circuitry 108, in that the circuitry 108 reads the register 114 but may not write to the register 114.

The monitoring interface 112 can include a current duration register 116 and a most recent duration register 118. The registers 116 and 118 are multiple-bit registers that each have a sufficient number of bits to store the duration of a clock cycle of the crystal oscillator 102. Clock cycle duration of the crystal oscillator 102 is effectively measured as a multiple of clock cycles of the DRO 106. Because the DRO 106 has a higher frequency than the crystal oscillator 102, for a given clock cycle of the oscillator 102 there will be multiple clock cycles of the DRO 106.

The current duration register 116 stores the duration of the current clock cycle of the crystal oscillator 102 currently being measured. The most recent duration register 118 stores the duration of the previous clock cycle of the oscillator 102 (i.e., the most recently completed clock cycle of the oscillator 102). The duration registers 116 and 118 are read-and-write registers from the perspective of the secure circuitry 108, and may be able to be read but not written by other components of the IC 104 and/or components external to the IC 104.

The monitoring interface 112 can include a maximum duration register 120 and a minimum duration register 122. The registers 120 and 122 are multiple-bit registers that also each have a sufficient number of bits to store the duration of a clock cycle of the crystal oscillator 102. The maximum duration register 120 stores the longest duration of any clock cycle of the crystal oscillator 102 that has been detected by the secure circuitry 108, whereas the minimum duration register 122 stores the shortest duration of any clock cycle of the oscillator 102 that has been detected by the circuitry 108. The duration registers 120 and 122 are read-and-write registers from the perspective of the secure circuitry 108, and may be able to be read but not written by other components of the IC 104 and/or components external to the IC 104.

The monitoring interface 112 can include a current variation register 124, a most recent variation register 125, and a maximum variation register 126. The registers 124, 125, and 126 are multiple-bit registers that each have a sufficient number of bits to store the variation in duration of the clock cycles of the crystal oscillator 102. Variation in clock cycle duration is also effectively measured as a multiple of clock cycles of the DRO 106. The variation in clock cycle duration is the variation between the duration of two consecutive clock cycles. The current variation register 124 stores the variation in duration between the current clock cycle of the crystal oscillator 102 currently being measured and the immediately prior clock cycle of the oscillator 102.

The most recent variation register 125 stores the variation in duration between the previous clock cycle of the crystal oscillator 102 and its immediately prior clock cycle (i.e., the variation in duration between the most recently completed clock cycle and the clock cycle prior to that clock cycle). The maximum variation register 126 stores the greatest variation in clock cycle duration of the oscillator 102 that has been detected by the circuitry 108. The variation registers 124, 125, and 126 are read-and-write registers from the perspective of the secure circuitry 108, and may be able to be read but not written by other components of the IC 104 and/or components external to the IC 104.

The monitoring interface 112 can include a maximum duration limit register 127 and a minimum duration limit register 128. The registers 127 and 128 are multiple-bit registers that each have a sufficient number of bits to store the duration of a clock cycle of the crystal oscillator 102. The maximum duration limit register 127 stores the longest permissible duration that a clock cycle of the crystal oscillator 102 can be, whereas the minimum duration limit register 128 stores the shortest permissible duration that a clock cycle of the oscillator 102 can be.

If the duration of a clock cycle of the crystal oscillator 102 exceeds either limit (i.e., is longer than the maximum limit or is shorter than the minimum limit), then the secure circuitry 108 may provide an alert to indicate the potential of security compromise of the computing device 100. The sensor circuitry 108 may issue an underclocking alert if the maximum duration limit is exceeded or an overclocking alert if the minimum duration limit is exceeded, for instance. The limit registers 127 and 128 are read-and-write registers from the perspective of the secure circuitry 108, and may be able to be read but not written by other components of the IC 104 and/or components external to the IC 104.

As noted, the actual frequency of the DRO 106 can vary based on operating voltage, operating temperature, and manufacturing tolerances. Therefore, the maximum duration limit specified in the maximum duration limit register 127 may initially be relatively large to take account of such variation. The minimum duration limit specified in the minimum duration limit register 128 may likewise initially be relatively small. As such, initially just occurrences of relatively extreme overclocking and underclocking may be triggered. Once the steady state clock cycle duration of the crystal oscillator 102 has been measured as a multiple of clock cycles of the DRO 106, the maximum and minimum duration limits specified in the registers 127 and 128 may be tightened (i.e., the minimum duration limit increased and the maximum duration limit decreased) for more sensitive triggering of less extreme overclocking and underclocking.

The monitoring interface 112 can include a maximum variation limit register 130. The register 130 is a multiple-bit register having a sufficient number of bits to store the variation in duration of the clock cycles of the crystal oscillator 102. The maximum variation limit register 130 stores the largest permissible variation in clock cycle duration that the crystal oscillator 102 can have. If the variation in clock cycle duration exceeds the limit (i.e., is larger than the maximum variation limit), then the secure circuitry 108 may provide an alert to indicate the potential of security compromise of the computing device 100. The sensor circuitry 108 may issue a glitching alert if the maximum variation limit is exceeded, for instance. The limit register 130 is a read-and-write register from the perspective of the secure circuitry 108, and may be able to be read but not written by other components of the IC 104 and/or components external to the IC 104.

The monitoring interface 112 can include an alert register 132 and an alert mask register 134. The registers 132 and 134 are each a multiple-bit register having a number of bits equal to the number of different kinds of alerts that the secure circuitry 108 can trigger. For instance, the registers 132 and 134 may each have three bits, with one bit corresponding to overclocking of the crystal oscillator 102, one bit corresponding to underclocking of the oscillator 102, and one bit corresponding to glitching of the oscillator 102.

The alert register 132 stores alerts that the secure circuitry 108 has triggered. If the maximum duration limit has been exceeded, the secure circuitry 108 may thus set an underclocking bit of the alert register 132; if the minimum duration limit has been exceeded, the circuitry 108 may set an overclocking bit of the register 132; and if the maximum variation limit has been exceeded, the circuitry 108 may set a glitching bit of the register 132. The alert register 132 is a read-and-write register from the perspective of the secure circuitry 108, and may be able to be read but not written by other components of the IC 104 and/or components external to the IC 104.

The alert mask register 134 stores an alert mask indicating the alerts that the secure circuitry 108 is to report. If an underclocking alert is to be reported when the maximum duration limit has been exceeded, an underclocking bit of the alert mask register 134 is set; if an overclocking alert is to be reported when the minimum duration limit has been exceeded, an overclocking bit of the mask register 134 is set; and if a glitching alert is to be reported when the maximum variation limit has been exceeded, a glitching bit of the register 134 is set.

The alert register 132 is thus masked by the alert mask register 134. Even if a bit of the alert register 132 is set, masking of the register 132 with the register 134 will not result in reporting of a corresponding alert if the corresponding bit of the alert mask register 134 is not set. The alert mask register 134 may be a read-and-write register from the perspective of components of the IC 104 other than the secure circuitry 108 and/or from the perspective of components external to the IC 104, and may be able to be read but not written by the circuitry 108.

The monitoring interface 112 can include a DRO monitor register 136 that is used to provide information as to whether the DRO 106 is properly operating. The DRO monitor register 136 is a multiple-bit register having a start bit, a valid bit, and a toggle bit. The start bit may be a read-and-write register from the perspective of components of the IC 104, including the secure circuitry 108 and/or from the perspective of components external to the IC 104. By comparison, the valid and toggle bits may be read-and-write registers from the perspective of the secure circuitry 108, and may be able to be read but not written by other components of the IC 104 or components external to the IC 104. The start bit of the DRO monitor register 136 is set to cause the secure circuitry 108 to restart the DRO 106. The secure circuitry 108 is to subsequently set the valid bit responsive to detecting that the DRO 106 is operational, and then may clear the start bit.

The secure circuitry 108 can include a toggle counter 140, which can be a multiple-bit counter that rolls over when the maximum value that the counter 140 can store has been exceeded. For example, if the toggle counter 140 is a four-bit counter, then once it stores the value 0x1111, the counter 140 rolls over to 0x0000 the next time it is incremented. The secure circuitry 108 may increment the toggle counter 140 each time the circuitry 108 sets the valid bit of the DRO monitor register 136. The secure circuitry 108 may further toggle the toggle bit of the monitor register 136 (i.e., switch it from zero to one and vice-versa) each time the circuitry 108 increments the toggle counter 140. The start bit of the register 136 is thus set each time the DRO 106 is to be restarted. The valid bit indicates whether the DRO 106 has ever been operational, whereas the toggle bit indicates whether the DRO 106 is operational after having been most recently restarted responsive to the most recent setting of the start bit.

The secure circuitry 108 is bidirectionally communicatively connected to the monitoring interface 112 in that the circuitry 108 can read from and/or write to various of the registers 114, 116, 118, 120, 122, 124, 125, 126, 127, 128, 130, 132, 134, and 136. There may also be bidirectional communicative connection between the monitoring interface 112 and other components internal to the IC 104, as indicated by bidirectional arrow 142, and/or between the interface 112 and components external to the IC 104, as indicated by the bidirectional arrow 144. Via triggering alerts on the alert register 132 as masked by the alert mask register 134, for instance, the secure circuitry 108 can cause actions to be performed to resolve issues causing impermissible overclocking, underclocking, and glitching to which the alerts correspond. As examples, an application being run on the computing device 100 may have its execution terminated, paused, or restarted, or the device 100 itself may be restarted.

As noted, the computing device 100 can include other components besides the crystal oscillator 102 and the IC 104. Further, the IC 104 can include other components besides the DRO 106, the secure circuitry 108, the oscillator interface 110, and the monitoring interface 112. For example, the IC 104 may include an asynchronous bridge to synchronize the clock signals of the crystal oscillator 102 and the DRO 106, since the oscillator 102 and the DRO 106 operate at different frequencies.

Figure 3:
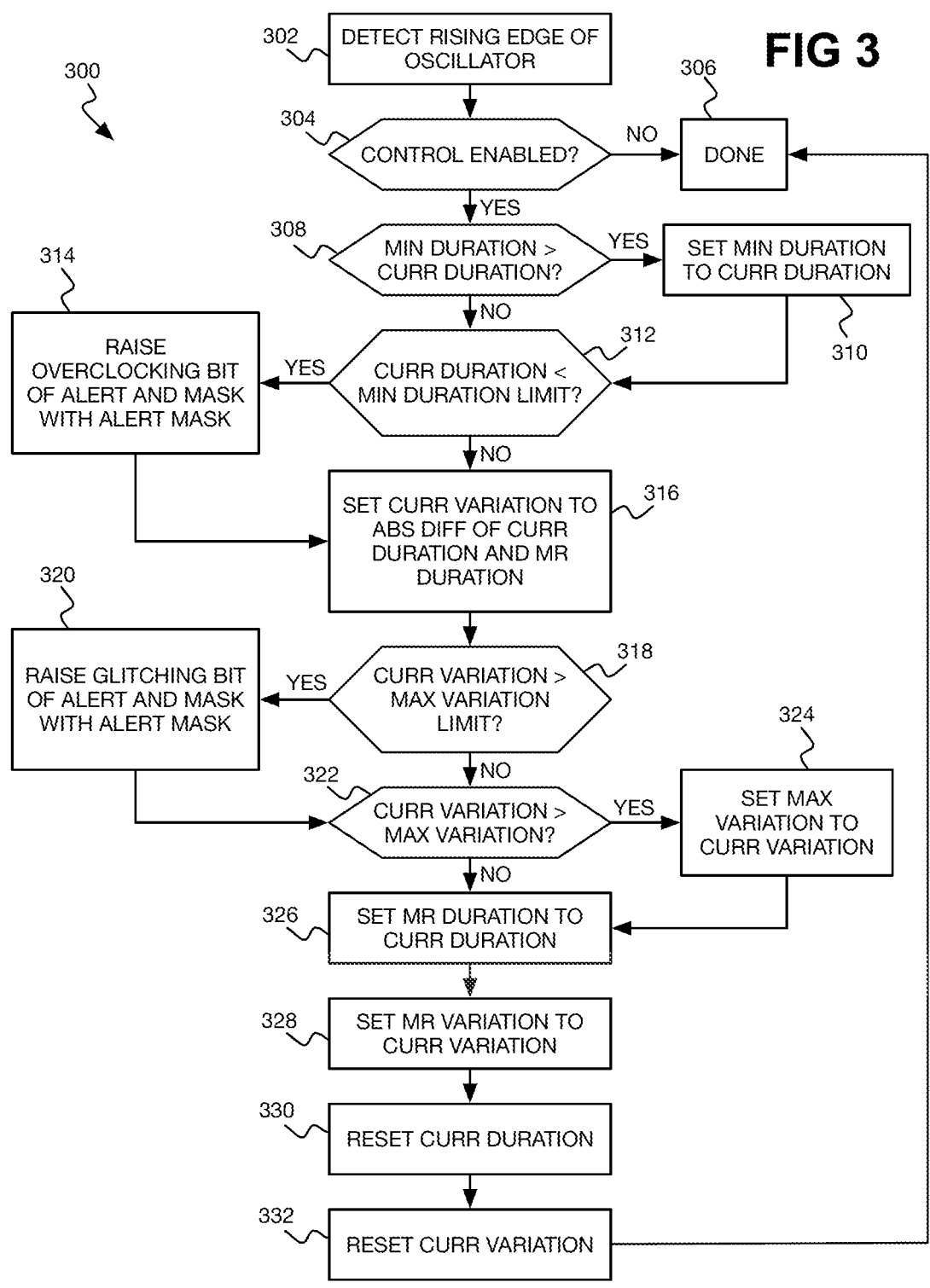
FIG. 3 is a flowchart of an example method that is used in conjunction with the method of FIG. 2 for monitoring a crystal oscillator, and which is specifically performed responsive to a rising edge of the crystal oscillator.

How the secure circuitry 108 monitors the crystal oscillator 102 using the DRO 106 to detect impermissible overclocking, underclocking, and glitching is now described, in relation to FIGS. 2 and 3. FIG. 2 shows an example method 200 that is performed by the secure circuitry 108 responsive to a rising edge of the DRO 106 (i.e., a rising edge of the clock cycle output by the DRO 106 at the specified frequency of the DRO 106), which means that a clock cycle of the DRO 106 has been completed and a new clock cycle has started. FIG. 3 shows an example method 300 that is performed by the secure circuitry 108 responsive to a rising edge of the crystal oscillator 102, which means that a clock cycle of the oscillator 102 has been completed and a new clock cycle has started.

The methods 200 and 300 can each be implemented as program code stored on a non-transitory computer-readable data storage medium and executable by a processor. For instance, the secure circuitry 108 may be implemented as a general-purpose processor, in which case the medium and the processor are separate discrete components of the circuitry 108. As another example, the secure circuitry 108 may be implemented as a specific-purpose processor, in which case the medium and the processor may be integrated within the circuitry 108 as an ASIC.

In FIG. 2, the secure circuitry 108 detects a rising edge of a clock cycle of the DRO 106 (202). If the control register 114 has not been enabled (204)—i.e., if the register 114 has not been set—then the method 200 is finished (206), since monitoring of the crystal oscillator 102 has not been enabled. Assuming that the control register 114 has been enabled (204), however, then the secure circuitry 108 increases the current clock cycle duration (210). That is, the secure circuitry 108 increments the current duration register 116. This means that the duration of the current clock cycle of the crystal oscillator 102 has been incremented by one, corresponding to a rising edge and thus another clock cycle of the DRO 106.

If the current duration is greater than the maximum duration limit specified in the maximum duration limit register 127 (212), then the secure circuitry 108 raises or sets the underclocking bit of the alert register 132 and masks the alert register 132 with the alert mask of the alert mask register 134 (214). As such, the secure circuitry 108 can trigger an underclocking alert as soon as the duration of the current clock cycle of the crystal oscillator 102 has exceeded the specified maximum duration limit. That is, the secure circuitry 108 does not have to wait until the current clock cycle has been completed.

The first bit of the alert register 132 may be the underclocking bit, such that the first bit of the alert mask register 134 is the masking bit corresponding to the underclocking bit. The first bit of the alert register 132 is set to one responsive to the current duration being greater than the maximum duration limit. However, if the corresponding masking bit of the alert mask register 134 is also not set to one, then the masking of the register 132 with the register 134 will result in the underclocking bit of the alert register 132 still being zero. That is, the corresponding masking bit of the alert mask register 134 is set to one to indicate that underclocking alerts are to be triggered, and is set to zero to indicate that such alerts are not to be triggered. Therefore, even if the underclocking bit of the alert register 132 is set to one, if the corresponding masking bit of the alert mask register 134 is set to zero, then the underclocking bit of the alert register 132 as masked will remain zero.

Next, if the current duration is greater than the maximum duration specified in the maximum duration register 120 (216), then the secure circuitry 108 sets the maximum duration to the current duration (218). That is, the secure circuitry 108 sets the maximum duration register 120 to the current duration register 116. The secure circuitry 108 can thus update the maximum duration register 120 as the duration of the current clock cycle of the crystal oscillator 102 has exceeded the prior maximum duration, and does not have to wait until the current clock cycle has been completed.

If the current duration is greater than the most recent duration specified in the most recent duration register 118 (220), then the secure circuitry 108 increases the current variation in clock cycle duration (222), which is the variation in duration between the current clock cycle of the crystal oscillator 102 and the immediately prior clock cycle of the oscillator 102. That is, the secure circuitry 108 increments the current variation register 124. The secure circuitry 108 in the example can thus track the current variation in clock cycle duration before the current clock cycle has been completed, in the case in which the current clock cycle is longer in duration than the immediately prior clock cycle. (In the case in which at completion the current clock cycle is shorter in duration than the immediately prior clock cycle, the current variation stored in the register 124 is not calculated until that time, as described later in the detailed description). If the current duration is not greater than the most recent duration (220), then the method 200 is finished (206).

If the current variation in clock cycle duration is greater than the maximum variation limit specified in the maximum variation limit register 130 (224), then the secure circuitry 108 raises or sets the glitching bit of the alert register 132 and masks the alert register 132 with the alert mask of the alert mask register 134 (226). As such, the secure circuitry 108 can trigger a glitching alert as soon as the current variation in clock cycle duration of the crystal oscillator 102 has exceeded the specified maximum variation limit. The secure circuitry 108 does not have to wait until the current clock cycle has been completed.

Next, if the current variation in clock cycle duration is greater than the maximum variation in clock cycle duration specified in the maximum variation register 126 (228), then the secure circuitry 108 sets the maximum variation to the current variation (230). That is, the secure circuitry 108 sets the maximum variation register 126 to the current variation register 124. The secure circuitry can thus update the maximum variation register 126 as the current variation in clock cycle duration of the crystal oscillator 102 has exceeded the prior maximum variation, and does not have to wait until the current clock cycle has been completed. The method 200 is then finished (206).

In FIG. 3, the secure circuitry 108 detects a rising edge of a clock cycle of the crystal oscillator 102 (302). As in the method 200, if the control register 114 has not been enabled (304)—i.e., if the register 114 has not been set—then the method 300 is finished (306). Assuming that the control register 114 has been enabled (304), however, if the minimum duration specified in the minimum duration register 122 is greater than the current duration (i.e., of the clock cycle of the oscillator 102 that has just been completed) (308), then the secure circuitry 108 sets the minimum duration to the current duration (310). That is, the minimum duration register 122 is set to the current duration register 116. Unlike the maximum duration specified in the maximum duration register 120, the minimum duration specified in the minimum duration register 122 is not updated in the example until a clock cycle of the crystal oscillator 102 has been completed.

If the current duration is less the minimum duration limit specified in the minimum duration limit register 128 (312), then the secure circuitry 108 raises or sets the overclocking bit of the alert register 132 and masks the alert register 132 with the alert mask of the alert mask register 134 (314). As such, the secure circuitry 108 does not trigger an overclocking alert until a clock cycle of the crystal oscillator 102 has been completed. The secure circuitry 108 then sets the current variation in clock cycle to the absolute difference of the current clock cycle duration and the most recent clock cycle duration (316). That is, the secure circuitry sets the current variation register 124 to the difference between the current duration register 116 and the most recent duration register 118.

The current variation set in the current variation register 124 will be identical to its prior value if the current clock cycle of the crystal oscillator 102 that just has been completed is longer in duration than the immediately prior clock cycle. This is because in that case, the current variation in clock cycle is updated with rising edges of the DRO 106 per the method 200 once the duration of the current clock cycle of the oscillator 102 exceeds the duration of the immediately prior clock cycle. The current variation in clock cycle is set to the absolute difference between the current duration and the most recent duration to take into account the case in which the current clock cycle of the oscillator 102 is at completion not longer in duration than the immediately prior clock cycle.

If the current variation in clock cycle is greater than the maximum variation limit specified in the maximum variation limit register 130 (318), then the secure circuitry 108 raises or sets the glitching bit of the alert register 132 and masks the alert register 132 with the alert mask of the alert mask register 134 (320), as in the method 200. A glitching alert can thus be triggered both when the current clock cycle duration is longer or shorter than the most recent clock cycle duration. Also as in the method 200, if the current variation in clock cycle duration is greater than the maximum variation in clock cycle duration specified in the maximum variation register 126 (322), then the secure circuitry 108 sets the maximum variation to the current variation (324). That is, the secure circuitry 108 sets the maximum variation register 126 to the current variation register 124. The maximum variation in clock cycle can thus similarly be set both when the current clock both when the current clock cycle duration is longer or shorter than the most recent clock cycle duration.

The secure circuitry 108 then sets the most recent duration to the current duration (326). That is, the most recent duration register 118 is set to the current duration register 116. The secure circuitry 108 similarly sets the most recent variation in clock cycle to the current variation in clock cycle (328). That is, the most recent variation register 125 is set to the current variation register 124. The secure circuitry 108 resets the current duration (330) and the current variation (332) by resetting the current duration register 116 and the current variation register 124 each to a value of zero. The method 300 is then finished (306).

In the methods 200 and 300 that have been described, functionality as to the variation in clock cycle duration can be performed even before the current clock cycle of the crystal oscillator 102 has been completed (corresponding to the method 300), as each clock cycle of the DRO 106 occurs (corresponding to the method 200). This is the functionality performed in parts 220, 222, 224, 226, 228, and 230 of FIG. 2. Such functionality is performed, though, just when the current clock cycle duration is greater than the most recent clock cycle duration (i.e., the duration of the immediately prior clock cycle). Therefore, corresponding functionality is still performed in the method 300 to take account of the case in which the current clock cycle duration is less than the most recent clock cycle duration. In another implementation, the variation-related functionality does not have to be performed in the method 200 as each DRO clock cycle occurs, since it is also performed in the method 300 at completion of the current crystal oscillator clock cycle.

Somewhat similarly, in the methods 200 and 300 that have been described, functionality as to the maximum duration and the maximum duration limit can be performed even before the current clock cycle of the crystal oscillator has been completed, as each clock cycle of the DRO 106 occurs. This is the functionality performed in parts 212, 214, 216, and 218 of FIG. 2. Such functionality can in another implementation instead be performed in the method 300 at completion of the current crystal oscillator clock cycle, instead of in the method 200 as each DRO clock cycle occurs.

Figure 4:
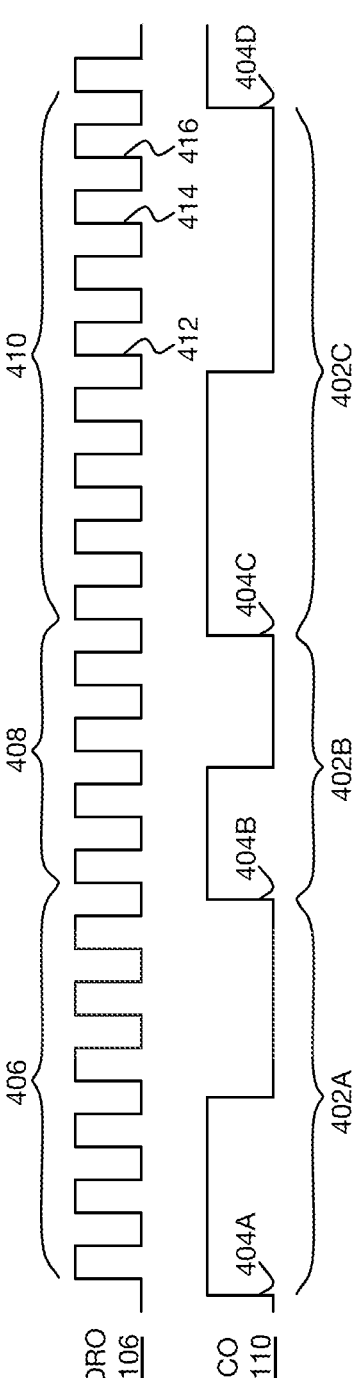
FIG. 4 is a diagram of example clock cycles of a crystal oscillator and a DRO, in relation to which example performance of the methods of FIGS. 2 and 3 is described.

FIG. 4 shows example clock signals of the DRO 106 and the crystal oscillator 102, in relation to which example performance of the methods 200 and 300 is described. The clock signal of the crystal oscillator 102 includes consecutive clock cycles 402A, 402B, and 402C having rising edges 404A, 4048, and 404C, respectively. The rising edges 404B, 404C, and 404D further demarcate ends of the clock cycles 402A, 402B, and 402C, respectively. The clock cycles 402A, 402B, and 402C are of different durations, with the clock cycle 402B being the shortest clock cycle and the clock cycle 402C being the longest clock cycle. The clock signal of the DRO 106 includes clock cycles 406 within the clock cycle 402A of the crystal oscillator 102, clock cycles 408 within the clock cycle 402B of the oscillator 102, and clock cycles 410 within the clock cycle 402C. Rising edges 412, 414, and 416 of certain clock cycles 410 are explicitly called out in the figure.

As the rising edge of each clock cycle 406 of the DRO 106 is detected, the method 200 is performed. The current duration register 116 and the maximum duration register 120 are incremented with each clock cycle 406. Therefore, when the rising edge 404B occurs, the registers 116 and 120 are each equal to six, which is the number of rising edges of clock cycles 406 that were detected and the number of times the method 200 was performed during the clock cycle 402A of the crystal oscillator 102.

Responsive to the rising edge 4048 of the clock cycle 402B of the crystal oscillator 102 being detected, the method 300 is performed. The most recent duration register 118 is set to the current duration register 116 and thus to a value of six, and the minimum duration register 122 may likewise be set to the current duration register 116 and also to a value of six. The current duration register 116 is reset to zero.

Thereafter, as the rising edge of each clock cycle 408 of the DRO 106 is detected, the method 200 is again performed. The current duration register 116 is incremented with each clock cycle 408. Therefore, when the rising edge 404C occurs, the register 116 is equal to four, which is the number of rising edges of clock cycles 408 that were detected and the number of times the method 200 was performed during the clock cycle 402B of the crystal oscillator 102.

Responsive to the rising edge 404C of the clock cycle 402C of the crystal oscillator 102 being detected, the method 300 is again performed. The minimum duration register is set to the current duration register 116 and thus to a value of four. The current variation register 124 is set to the absolute difference between the current duration register 116 and the most recent duration register 118, which is the absolute difference between four and six, or two. The maximum variation register 126 may be set to the current variation register 124, and thus to two as well. The most recent duration register 118 and the most recent variation register 125 are respectively set to the current duration register 116 and the current variation register 124, or to four and two, respectively. The registers 118 and 125 are then reset to zero.

Thereafter, as the rising edge of each clock cycle 410 of the DRO 106 is detected, the method 200 is again performed. The current duration register 116 is incremented with each clock cycle 410. Starting with the fifth clock cycle 410 having the rising edge 412, the current variation register 124 is also incremented, since the current duration register 116 is then greater than the most recent duration register 118, which has a value of four. Starting with the seventh clock cycle 410 having the rising edge 414, the maximum duration register 120 is set to the current duration register 116, since the current duration of seven is at the rising edge 414 longer than the maximum duration of six. At the eighth clock cycle 410 having the rising edge 416, the maximum variation register 126 is also set to the current variation register 124, since the current variation of three is at the rising edge 416 greater than the maximum variation of two.

Responsive to the rising edge 404D that ends the clock cycle 402C of the crystal oscillator 102 being detected, the method 300 is performed. The most recent duration register 118 is set to the current duration register 116 and thus to a value of eight, which is the number of rising edges of the clock cycles 410 of the DRO 106 detected and thus the number of times the method 200 is performed during the clock cycle 402C. The most recent variation register 125 is set to the current variation register 124, or three. The current duration register 116 and the most recent variation register 125 are then reset to zero.

Figure 5:
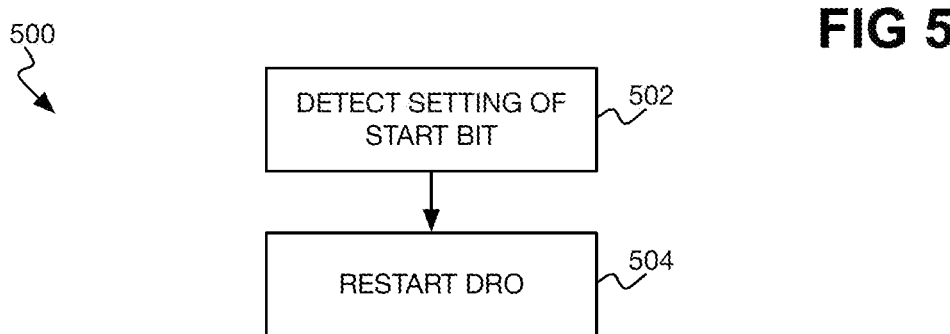
FIG. 5 is a flowchart of an example method that can be used in conjunction with the methods of FIGS. 2 and 3 for monitoring a crystal oscillator, which is performed to verify that the DRO of the IC of FIG. 1 is operational, and which is specifically performed responsive to setting of a start bit to restart the DRO.
Figure 6:
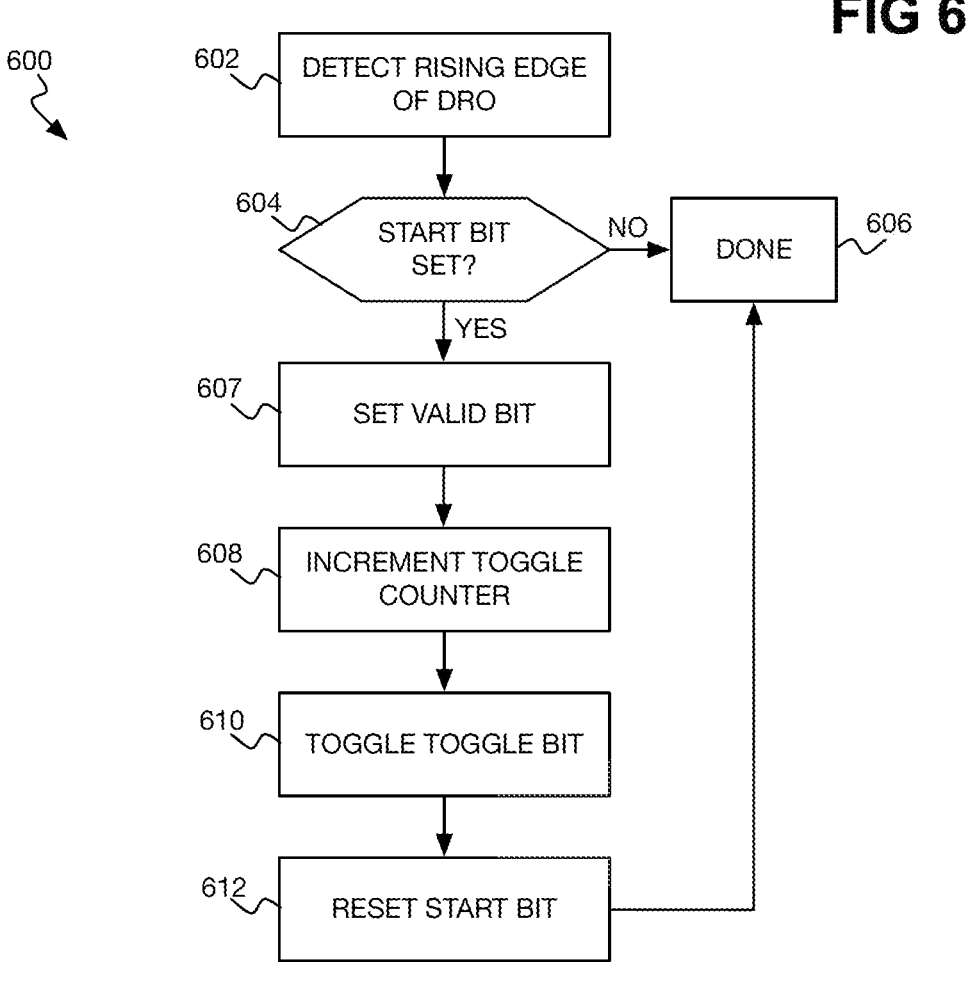
FIG. 6 is a flowchart of an example method that can be used in conjunction with the methods of FIGS. 2 and 3 for monitoring a crystal oscillator, which is performed along with the method of FIG. 5 to verify that the DRO of the IC of FIG. 1 is operational, and which is performed responsive to a rising edge of the DRO after the DRO has been restarted.

How the secure circuitry 108 monitors the DRO 106 to ensure that the DRO 106 is properly operating is now described, in relation to FIGS. 5 and 6. FIG. 5 shows an example method 500 that is performed by the secure circuitry 108 responsive to the setting of the start bit of the DRO monitor register 136. FIG. 6 shows an example method 600 that is performed that is performed by the secure circuitry 108 responsive to a rising edge of the crystal oscillator 102 (i.e., a rising edge of the clock cycle output by the oscillator 102 at the specified frequency of the oscillator 102) when the start bit of the register 136 has been set. As with the methods 200 and 300, the methods 500 and 600 can each by implemented as program code stored on a non-transitory computer-readable data storage medium and executable by a processor, and thus by the secure circuitry 108.

In FIG. 5, the secure circuitry 108 detects the setting of the start bit of the DRO monitor register 136 (502), indicating that the DRO 106 is to be restarted. The secure circuitry 108 thus responsively restarts the DRO 106 (504). The method 500 therefore restarts the DRO 106 responsive to the setting of the start bit.

In FIG. 6, the secure circuitry 108 detects the rising edge of the DRO 106 (602). If the start bit of the DRO monitor register 136 is not currently set (604), then the method 600 is finished (606). That is, the method 600 is effectively performed the first time the rising edge of the DRO 106 is detected after the DRO 106 has been reset. Therefore, if the start bit is currently set (604), the secure circuitry 108 sets the valid bit of the DRO monitor register 136 (607). The secure circuitry 108 also increments the toggle counter 140 (608) and toggles the toggle bit of the DRO monitor register 136 (610). The secure circuitry 108 then resets the start bit of the register 136 (612), which ends the method 600 (606).

A component external to the secure circuitry 108 within the IC 104 or a component external to the IC 104 can therefore set the start bit to cause restarting of the DRO 106. The component can read the valid bit to determine if the DRO 106 was ever operational, responsive to the most recent restarting of the DRO 106 or any prior restart of the DRO 106. This is because the secure circuitry 108 does not clear the valid bit once the valid bit has been set. By comparison, the component can read the toggle bit to determine if the DRO 106 is currently operational, responsive to the most recent restart of the DRO 106. This is because the secure circuitry toggles the toggle bit each time the toggle counter 140 is incremented.

FIG. 7 shows a non-transitory computer-readable data storage medium 700 storing program code 702 executable by the secure circuitry 108 of the IC 104 to perform processing. The processing includes tracking a duration of a clock cycle of a crystal oscillator 102 external to the IC 104, using a DRO 106 internal to the IC 104 and having a higher frequency than the crystal oscillator 102 (704). The processing includes tracking a variation in the duration of the clock cycle (706).

The processing includes, in response to the duration being greater than a maximum duration limit, performing a first action (708). The maximum duration limit corresponds to a minimum frequency at which the crystal oscillator 102 is permitted to operate. The duration being greater than the maximum duration limit can indicate that the crystal oscillator 102 has been impermissibly underclocked. The first action may be the triggering of an underclocking alert, or an action that resolves an issue causing impermissible underclocking of the crystal oscillator 102, such as rebooting the computing device 100, or restarting, pausing, or terminating the application currently being executed by a processor of the device 100.

The processing includes, in response to the duration being less than a minimum duration limit, performing a second action (710). The minimum duration limitation corresponds to a maximum frequency at which the crystal oscillator 102 is permitted to operate. The duration being less than the minimum duration limit can indicate that the crystal oscillator 102 has been impermissibly overclocked. The second action may be the triggering of an overclocking alert, and thus a different action than the first action. The action may instead resolve an issue causing impermissible overclocking of the crystal oscillator 102, and which may be the same action as the first action.

The processing includes, in response to the variation being greater than a maximum variation limit, performing a third action (712). The maximum variation limit corresponds to a maximum variation in frequency that the crystal oscillator 102 is permitted to have. The variation being greater than the maximum variation limit can indicate that the crystal oscillator 102 has been impermissibly glitched. The third action may be the triggering of a glitching alert, and thus a different action than the first and second actions. The action may instead resolve an issue causing impermissible glitching of the crystal oscillator 102, and which may be the same action as the first and second actions.

Figure 8:
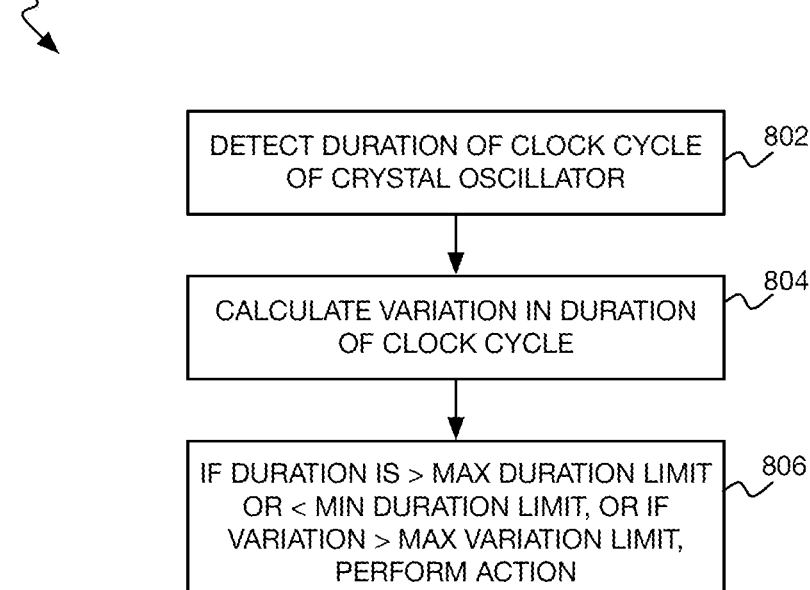
FIG. 8 is a flowchart of an example method performed by the secure circuitry of the IC of FIG. 1 to monitor a crystal oscillator using the DRO of the IC.

FIG. 8 shows an example method 800 that can be performed by the secure circuitry 108 of the IC 104. The method 800 includes detecting a duration of a clock cycle of the crystal oscillator 102 external to the IC 104, using the DRO 106 internal to the IC 104 and that has a higher frequency than the crystal oscillator 102 (802). The method 800 includes calculating, by the secure circuitry, a variation in the duration of the clock cycle (804). The method 800 includes, in response one or multiple of the duration being greater than a maximum duration limit, the duration being less than a minimum duration limit, and the variation being greater than a maximum variation limit, performing an action (806).

Techniques have been described for monitoring a crystal oscillator 102. The techniques specifically monitor the frequency of the crystal oscillator 102 using a DRO 106 having a higher frequency than the oscillator 102. Whether the crystal oscillator 102 has been overclocked, underclocked, or glitched can thus be detected, and which may be indicative of a compromise in security of the computing device 100 of which the crystal oscillator 102 is a part.

We claim:
1. A method comprising:
detecting, a duration of a clock cycle of a crystal oscillator using a digital ring oscillator wherein;
  the digital ring oscillator is internal to an integrated circuit and the crystal oscillator is external to the integrated circuit;
  the integrated circuit is inaccessible by components of a computing device except through an oscillator interface and a monitoring interface; and
  the digital ring oscillator has a higher frequency than the crystal oscillator;
calculating, based on secure circuitry of the integrated circuit receiving a signal from the digital ring oscillator and receiving a signal from the oscillator interface, a variation in the duration of the clock cycle;

increasing the duration in response to a rising edge of the digital ring oscillator; and
setting a most recent duration to the duration, and resetting the duration in response to the rising edge of the crystal oscillator.

2. The method of claim 1, wherein a maximum duration limit of the duration corresponds to a minimum frequency at which the crystal oscillator is permitted to operate, and a minimum duration limitation of the duration corresponds to a maximum frequency at which the crystal oscillator is permitted to operate,
  wherein the duration being greater the maximum duration limit indicates that the crystal oscillator has been impermissibly underclocked, and the duration being less than the minimum duration limit indicates that the crystal oscillator has been impermissibly overclocked,
  and wherein an action resolves an issue causing impermissible overclocking or underclocking of the crystal oscillator.

3. The method of claim 2, wherein a maximum variation limit corresponds to a maximum variation in frequency that the crystal oscillator is permitted to have,
  wherein the variation being greater than the maximum variation limit indicates that the crystal oscillator has been impermissibly glitched,
  and wherein the action resolves an issue causing impermissible glitching of the crystal oscillator.

4. The method of claim 2, wherein performing the action comprises:
  in response to the duration being greater than the maximum duration limit, performing a first action;
  in response to the duration being less than the minimum duration limit, performing a second action different than the first action; and
  in response to the variation being greater than the maximum variation limit, performing a third action different than the first and second actions.

5. A non-transitory computer-readable data storage medium storing program code executable by secure circuitry of an integrated circuit inaccessible by components of a computing device except through an oscillator interface and a monitoring interface to:
  receive a signal from a crystal oscillator external to the integrated circuit via the oscillator interface;
  track a duration of a clock cycle of the crystal oscillator external to the integrated circuit, using a digital ring oscillator internal to the integrated circuit and having a higher frequency than the crystal oscillator by:
    in response to a rising edge of the digital ring oscillator, increasing the duration; and
    in response to the rising edge of the crystal oscillator, setting a most recent duration to the duration, and resetting the duration; and
  track a variation in the duration of the clock cycle.

6. The non-transitory computer-readable data storage medium of claim 5, wherein the program code is executable by the secure circuitry to further:
  in response to the duration being greater than a maximum duration limit, perform a first action to resolve impermissible underclocking of the crystal oscillator;
  in response to the duration being less than a minimum duration limit, perform a second action to resolve impermissible overclocking of the crystal oscillator; and
  in response to the variation being greater than a maximum variation limit, perform a third action to resolve impermissible glitching of the crystal oscillator.

7. The non-transitory computer-readable data storage medium of claim 5, wherein the program code is executable by the secure circuitry to track the duration of the clock cycle of the crystal oscillator using the digital ring oscillator by further:

in response to the rising edge of the digital ring oscillator or in response to the rising edge of the crystal oscillator, setting a maximum duration to the duration if the maximum duration is less than the duration; and in response to the rising edge of the crystal oscillator, setting a minimum duration to the duration if the minimum duration is greater than the duration.

8. The non-transitory computer-readable data storage medium of claim 5, wherein the program code is executable by the secure circuitry to track the variation in the clock cycle by:

in response to the rising edge of the digital ring oscillator, increasing the variation if the duration is greater than a most recent duration; and in response to the rising edge of the oscillator, setting the variation to an absolute difference between the duration and the most recent duration, setting a most recent variation to the variation, and resetting the variation.

9. The non-transitory computer-readable data storage medium of claim 8, wherein the program code is executable by the secure circuitry to track the variation in the clock cycle by further:

in response to the rising edge of the digital ring oscillator, setting a maximum variation to the variation if the maximum variation is less than the variation; and in response to the rising edge of the oscillator, setting the maximum variation to the variation if the maximum variation is less than the variation.

10. An integrated circuit comprising:

an oscillator interface on which a crystal oscillator external to the integrated circuit is monitored;

a digital ring oscillator having a frequency greater than the crystal oscillator;

a monitoring interface on which alerts are triggered responsive to monitoring the crystal oscillator; and secure circuitry to:

track a duration of a clock cycle of the crystal oscillator using the digital ring oscillator by:

in response to a rising edge of the digital ring oscillator, increasing the duration;

in response to the rising edge of the digital ring oscillator or in response to the rising edge of the crystal oscillator, setting a maximum duration to the duration if the maximum duration is less than the duration; and in response to the rising edge of the crystal oscillator, setting a minimum duration to the duration if the minimum duration is greater than the duration, setting a most recent duration to the duration, and resetting the duration; and track a variation in the duration of the clock cycle;

in response to the duration being greater than a maximum duration limit, trigger an underclocking alert;

in response to the duration being less than a minimum duration limit, trigger an overclocking alert; and in response to the variation being greater than a maximum variation limit, trigger a glitching alert, wherein, the integrated circuit is accessible only by the oscillator interface and the monitoring interface.

11. The integrated circuit of claim 10, wherein the monitoring interface comprises a multiple-bit digital ring oscillator monitor having a plurality of bits, and wherein the secure circuitry is to further:

in response to setting of a start bit of the digital ring oscillator monitor, the secure circuitry is to restart the digital ring oscillator; and in response to a rising edge of the digital ring oscillator, the secure circuitry is to set a valid bit of the digital ring oscillator monitor, increment a toggle counter, toggle a toggle bit of the digital ring oscillator monitor, and reset the start bit if the start bit has been set.

12. The integrated circuit of claim 10, wherein the secure circuitry is to track the variation in the clock cycle by:

in response to the rising edge of the digital ring oscillator, increasing the variation if the duration is greater than a most recent duration, and setting a maximum variation to the variation if the maximum variation is less than the variation; and in response to the rising edge of the oscillator, setting the variation to an absolute difference between the duration and the most recent duration, setting the maximum variation to the variation if the maximum variation is less than the variation, setting a most recent variation to the variation, and resetting the variation.

13. The integrated circuit of claim 10, wherein the monitoring interface comprises a multiple-bit alert having a plurality of bits, wherein the secure circuitry is to trigger the underclocking alert by setting an underclocking bit of the alert and masking the alert with a multiple-bit mask having a plurality of bits corresponding to the bits of the alert, is to trigger the overclocking alert by setting an overclocking bit of the alert and masking the alert with the mask, and is to trigger the glitching alert by setting a glitching bit of the alert and masking the alert with the mask, and wherein an underclocking bit of the mask indicates whether the underclocking alert is to be reported, an overclocking bit of the mask indicates whether the overclocking alert is to be reported, and a glitching bit of the mask indicates whether the glitching alert is to be reported.

* * * * *